United States Patent [19]

Gimpelson et al.

[11] Patent Number: 4,515,652

[45] Date of Patent: May 7, 1985

[54] PLASMA SCULPTURING WITH A NON-PLANAR SACRIFICIAL LAYER

[75] Inventors: George E. Gimpelson, Indialantic; Cheryl L. Russo, Palm Bay, both of Fla.

[73] Assignee: Harris Corporation, Melbourne, Fla.

[21] Appl. No.: 591,597

[22] Filed: Mar. 20, 1984

[51] Int. Cl.$^3$ .................. B44C 1/22; C03C 15/00; C03C 25/06; B29C 17/08

[52] U.S. Cl. .................. 156/643; 156/646; 156/657; 156/668; 204/192 E; 252/79.1; 427/38

[58] Field of Search .............. 156/643, 646, 653, 657, 156/659.1, 662, 668; 252/79.1; 204/192 EC, 192 E; 427/38, 39, 93, 88, 258, 270, 271

[56] References Cited

U.S. PATENT DOCUMENTS

| | | |
|---|---|---|
| 3,718,514 | 2/1973 | Erdman et al. |
| 4,025,411 | 5/1977 | Hom-Ma et al. |
| 4,293,588 | 10/1981 | Neukomm |
| 4,377,438 | 3/1983 | Moriya et al. ............ 156/646 X |

OTHER PUBLICATIONS

"Plasma Planarization"; A. C. Adams; Solid State Technology; Apr., 1981; pp. 178-181.
"A 6K-Gate CMOS Gate Array"; Terio Kobayashi et al.; IEEE International Solid-State Circuits Conference; Feb. 11, 1982, pp. 174-175.
"Planarization Properties of Resist and Polyimide Coatings"; Journal of the Electrochemical Society; Jul., 1983, pp. 1543-1548, White.
"Planarization of Phosphosilicate Glass Films"; L. F. Johnson et al.; J. Vac. Sci. Technol. B; (2); Apr.-Jun. 1983; pp. 487-489.
"LSI Surface Leveling by RF Sputter Etching"; Yoshio Hom-Ma et al., J. Electrochem. Soc.; Sep. 1979; pp. 1531-1533.
J. Electrochem. Soc. Solid-State Science and Technology, vol. 128, No. 2, Feb. 1981, Planarization of Phosphorus-Doped Silicon Dioxide, A. C. Adams et al., pp. 423-429.

*Primary Examiner*—William A. Powell
*Attorney, Agent, or Firm*—Barnes & Thornburg

[57] ABSTRACT

A method of plasma planarization of the surface topography of a substrate layer is provided wherein a sacrificial layer, having an etch rate substantially different from the etch rate of the substrate layer, is applied to the surface topography of that substrate layer. The sacrificial and substrate layers are then plasma etched to remove the sacrificial layer and portions of the substrate layer. The ratio of substrate layer to sacrificial layer etch rate can be controlled by the specific material and etchant used to compensate for non-planar surface features of the sacrificial layer such that the resulting substrate surface topography is planar.

19 Claims, 3 Drawing Figures

PLASMA SCULPTURING WITH A NON-PLANAR SACRIFICIAL LAYER

BACKGROUND AND SUMMARY OF THE INVENTION

The present invention relates generally to plasma etching and, more particularly, to plasma planarization of semiconductor device layers.

As integrated circuit geometries increase in complexity and decrease in dimensions to below one micron, it becomes increasingly important to provide component layers with smooth or planar surface topographies. Planar surfaces are necessary to insure acceptable step coverage, reduce reflections during photolithography, and, in general, improve product yields. Planar surfaces are especially important in MOS technologies where initial topographies are often extremely rough. For example, where a metallic or conductive path is applied to a semiconductor substrate, the sidewalls and edges of that path typically present unacceptable steps. These steps would often inhibit proper application of additional device layers.

To reduce sidewall angles and soften edges, previous fabrication processes have included high temperature "reflow" techniques. The substrate and glass thereon would be heated to temperatures where the glass softens and starts to melt. The substrate, however, maintains its stability at these temperatures. Unfortunately, reflow techniques have often proved unsatisfactory where metal is used. To insulate these paths, oxide layers are typically applied between them. These oxide layers substantially conform to the underlying surface topography. Thus, subsequent paths applied directly to the oxide would not have a planar base surface. Without a planar base surface, designing complex, multi-layer circuits becomes extremely difficult. Attempts to apply reflow techniques to the oxide layers are not successful. Temperatures high enough to soften the oxide and cause it to flow into and fill surface steps also cause underlying metal paths to melt or peal off adjacent layers or alloy with the silicon. This results in silicon surface pits and catastrophic device failures. Further, such high temperature processing will generally enlarge device dimensions and promote poor feature size control which subsequently causes loss of device packing density.

Recently, low temperature plasma etching techniques for smoothing rough and irregular surface topographies have been developed. These are often referred to as "plasma planarization" or "plasma filing". As seen in the sectional view of FIG. 1, plasma planarization typically involves the use of a sacrificial layer 10 which is applied over rough topography 20 of insulating layer 30. Rough topography 20 may, for example, result from conformity of insulating layer 30 to metal path 40 formed on insulative layer 50 of substrate base 60. Prior research and experimentation have been directed toward achieving a planar surface 15 on sacrificial layer 60 10. This multi-layered product is subjected to plasma etching in a gas environment to completely remove sacrificial layer 10 and portions of insulating layer 30. Sacrificial layer 10 is etched away at the same rate as the material of insulating layer 30. As a result, the topography of relatively smooth surface 15 can be replicated on the surface insulating layer 30 without detrimentally affecting metal path 40.

Such plasma planarization techniques have been used to smooth surfaces of several materials, including polysilicon, nitrides, and various glasses. A variety of sacrifical layers have also been used, including photoresists, polyimide, and nitrides. Unfortunately, while previous plasma planarization techniques may be suitable for fabrication of some larger, less detailed integrated circuits, they do not produce surfaces which are sufficiently planar for many smaller and more complex circuit devices.

Surface roughness and irregularities remaining after such plasma planarization are largely the result of minute steps and depressions in surface 15 of sacrificial layer 10. These steps and depressions arise because the materials employed in sacrificial layer 10 typically have at least some minor conformity to the underlying topography of insulating layer 30. This conformity is reflected, although in diminished form, in the topography of surface 15. Conformity of sacrificial layer 10 is especially important where the underlying topography consists of recesses and projections having a wide variety of dimensions and where sacrificial layer 10 is relatively thin. It has been suggested to increase the thickness or height of sacrificial layer 10 above insulating layer 30 to achieve greater planarity of surface 15. However, increasing the thickness of sacrificial layer 10 causes significant increases in the planarization processing time and expense.

Further difficulties also arise with the relatively narrow processing constraints of these prior techniques. The ratio of the etch rates of the sacrifical layer to the underlying insulating layer must, as nearly as possible, be unity if the topography of surface 15 is to be properly replicated. Even the smallest deviation from a unity ratio is considered undesirable.

It is therefore an object of the present invention to provide an improved method of controlling surface topography.

Another object is the provision of an improved method of plasma planarizing surface topography of semiconductor device layers.

Still yet another object is to provide a method of planarization which may be applied sequentially to various layers of a semiconductor device during the fabrication of that device without adversely affecting the underlying layer.

Yet another object is to provide a method of plasma planarization, for surface topography of various different heights and dimensions, having a short processing time.

An even further object is to provide a method of plasma planarization which can be repeatedly reworked to planarize a given surface.

Still another object is the provision of a method of plasma planarization having relatively enhanced processing latitudes.

These and other objects of the present invention are attained in the provision of a method of plasma planarization of the surface topography of a substrate layer wherein a sacrificial layer, having an etch rate substantially different from the etch rate of the substrate layer, is applied to the surface topography of that substrate layer. The sacrificial and substrate layers are then plasma etched to remove the sacrificial layer and portions of the substrate layer. The ratio of substrate to sacrificial layer etch rate can be controlled to compensate for non-planar surface features of the sacrificial layer such that the resulting substrate surface topography is planar. Control of this etch rate ratio is accomplished by selecting appropriate materials forming the sacrificial layer for a given plasma environment and by selecting the appropriate plasma environment for a given material forming the sacrificial layer.

The etch rate ratio necessary to planarize a rough surface topography is solely a function of the material forming the sacrificial layer and the thickness of that layer, rather than a function of the height of surface projections. The sacrificial layer is preferably formed from a low viscosity, organic photoresist which at least covers the underlying surface topography. Typical etch rate ratios to achieve surface planarity of the substrate layer range from 1.4 to 10.0 in plasma environments of gaseous $CHF_3$ and $O_2$ for example. Since sacrificial layer can be relatively thin, short planarization processing times are achievable. Using this plasma etching technique of selecting the etch rate ratio to be a non-unity value, a variety of different surface topographies can be sculptured simultaneously. This planarization process may be applied to succeeding layers during semiconductor device fabrication without adversely affecting the underlying layers.

Further objects, features, and advantages of the present invention will become more apparent from the following description when taken with the accompanying drawings which show, for purposes of illustration only, several embodiments in accordance with the present invention.

DETAILED DESCRIPTION OF THE DRAWINGS

Figure 1:
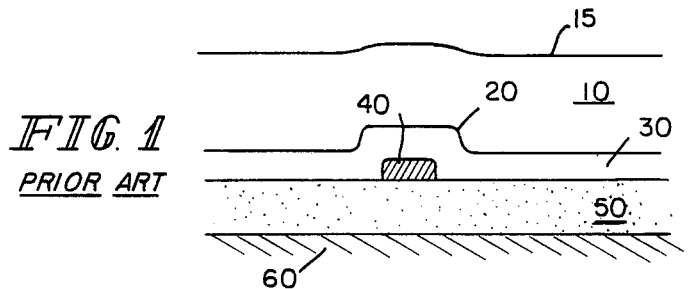
FIG. 1 is a sectional view of the pre-etching stage of prior planarization methods.
Figure 2:
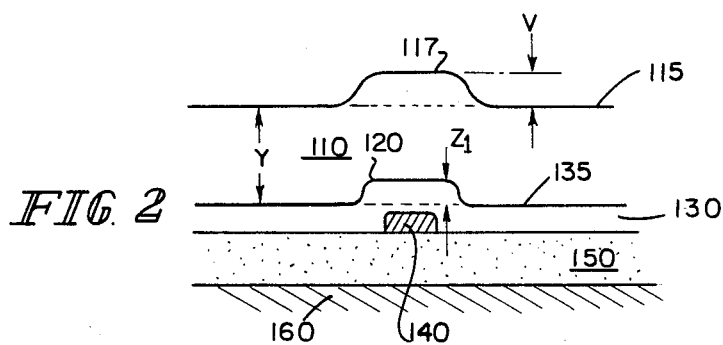
FIG. 2 is a sectional view of the pre-etching stage according to the principles of the present invention.
Figure 3:
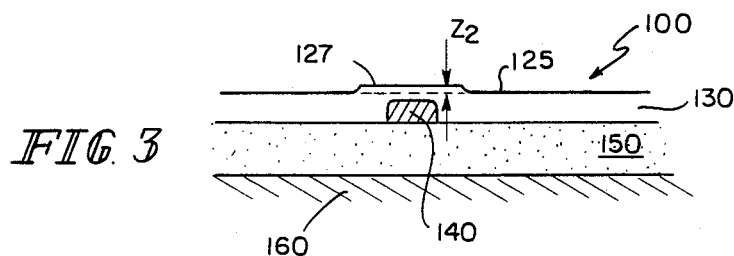
FIG. 3 is a sectional view of the device shown in FIG. 2 after plasma planarization according to the principles of the present invention.

FIG. 2 shows a sectional illustration of a portion of a semiconductor device 100, employing the method of planarization according to the present invention, prior to plasma etching. Sacrificial layer 110 is formed over topographical features 120, which present a rough surface on substrate layer 130. Device 100 is then plasma etched to remove sacrificial layer 110 and topographical features 120 and produce a smooth, upper surface 125 on substrate layer 130, as shown in the sectional illustration of FIG. 3.

A typical semiconductor device 100 suitable for planarization acording to the present invention includes a base substrate 160 formed from a semiconductor material and an insulated layer 150 therein. Conductor lines 140 are, for example, deposited on insulating layer 150 and may be formed from aluminum lines of one micron in thickness. Substrate layer 130, having upper surface 135, is formed to cover conductor lines 140 and at least a portion of insulating layer 150. Substrate layer 130 may, for example, function to insulate conductor lines 140 from subsequently applied layers. Preferably, substrate layer 130 is formed from a conformal, low temperature oxide. Selecting low temperature oxides for this purpose avoids the need for high planarization processing temperatures which could adversely affect underlying layers. Conformability of this oxide is often necessary to insure that especially rough topographical features are completely covered.

This conformity of substrate layer 130 typically results in the formation of topographical features 120 having a height $Z_1$ on upper surface 135 of substrate layer 130. These features 120 correspond substantially with the configuration of insulating layer 150 and base substrate 160 and the various elements formed thereon. Thus, while only a single rectangular form of conducting line 140 and corresponding step 120 are specifically illustrated, it will be clearly understood by those skilled in the art that a wide variety of projections and recesses of various different dimensions may be formed in various combinations on base substrate 150 depending upon the circuit design of device 100. These projections and recesses would have similar, corresponding features on surface 135.

Sacrificial layer 110, having upper surface 115, is flowed over substrate layer 130 to at least completely cover those portions of substrate layer 130 to be plasma etched. Preferably, sacrificial layer 110 is formed from a low viscosity, organic material. One such suitable material is a Hunt's positive photoresist (HPR-204) layer. Sacrificial layer 110 is partially conformal to the topography of underlying surface 135. Thus, surface 115 is non-planar and includes topographical features 117 in the form of diminished steps of a height V above surface 115. These steps correspond generally to and result from underlying features 120.

After formation of substrate layer 130 and sacrificial layer 110, portions of device 100 may be plasma etched. Dependency upon the desired topography of resulting surface 125 of substrate layer 130, plasma etching may remove all or part of sacrificial layer 110 along with portions of substrate layer 130. Device 100 may be plasma etched in a reactive ion etcher with gaseous $CHF_3$ and $O_2$ for example. Other etching gases may be used.

Unlike prior plasma etching methods, the present invention achieves plasma sculpturing by selecting the ratio of the substrate layer to sacrificial layer etch rates to be various non-unity values. For example, where planarization of substrate layer 130 is desired, the method of the present invention employs a non-unity etch rate ratio to compensate for non-planar surface features 117 of sacrificial layer 110, rather than attempting to planarize surface 115. In particular, planarization can be achieved by etching substrate layer 130 faster than sacrificial layer 110. The precise etch rate ratio necessary to achieve planarization where sacrificial layer 110 is completely removed is determinable from the following equation:

$$E_2/E_1 = Z_1/Z_1 - V \qquad \text{Eq. 1}$$

where $E_2$ is the etch rate of underlying substrate layer 130, $E_1$ is the etch rate of sacrificial layer 110, and $Z_1$ and V are, as defined above, the heights of features 120 and 117, respectively.

Once the desired etch rate ratio is known, appropriate materials may be selected to form layers 110 and 130 to achieve this ratio. Alternatively, or supplementarily, the etch rate ratio for given layer materials can be altered by changing the plasma etching environment. For example, the etch rate ratio between the above-described oxide and photoresist layers is a function of the flow rate of $CHF_3$ in a reactive ion etcher where the $O_2$ flow, RF power, and chamber pressure are held constant at 50 cc/min, 1000 watts, and 50 Mtorr, respectively. Variations in the CHF₃ flow rate between 30 cc/min and 65 cc/min results in changes in the etch rate ratio from 0.7 to 1.4. Alternatively, the etch rate ratio can be varied by changing the flow rate of the $O_2$ or the RF power or the chamber pressure.

In FIG. 2, sacrificial layer 110 is shown to have a thickness Y over substrate layer 130. Since the planarization method of the present invention does not require surface 115 to be planar, sacrificial layer 110 can be significantly thinner than the prior sacrificial layer. This results in decreased processing times and increased cost efficiencies in semiconductor device fabrication.

While extremely thin sacrificial layers can, in some embodiments, be useful, the method of planarizing according to the present invention presents an especially important advantage where thickness Y of sacrificial layer 110 is chosen to be at least larger than the unplanarized height of topographical feature 120. In such circumstances, a plurality of different topographical features, having different heights up to the sacrificial layer thickness, will be plasma planarized during a single planarization step with a properly selected non-unity etch rate ratio. A similar result is attained where the sacrificial layer 110 completely fills every depression of substrate layer 130. This result is due to the flow characteristics of low viscosity sacrificial layer materials, such as photoresists. Considering the variety of different feature heights encountered across the surface of a processed wafer, this is a significant improvement. The proper selection of etch rate ratio is determinable from the following equation:

$$E_2/E_1 = (1-K)^{-1} \qquad \text{eq. 2}$$

where $E_2$ and $E_1$ are defined as above, and K is a proportionality constant that depends upon the linear conformity characteristics of the sacrificial layer. Thus, the etch rate ratio in these embodiments is independent of the dimensions of topographical features 120. K may be determined experimentally for photoresist sacrificial layers of the above-described thickness from the following equation:

$$K = Z_1/V \qquad \text{eq. 3}$$

Typically, K has a value between 0.3 and 0.9. Therefore, in these embodiments, the etch rate ratio will be selected to be between 1.4 and 10.0.

The above discussion of plasma planarization has assumed that it is desired to form resulting surface 125 with completely planar topography. In such cases, planarity will depend upon the ability to achieve the desired etch rate ratio precisely. However, in some circumstances a degree of non-planarity of surface 125, resulting in diminished topographical features 127, is permissible. If so, the processing latitude on the etch rate ratio may be relatively enhanced. If a height (or depth, if feature 127 is a depression) $Z_2$ of feature 127 can be tolerated, the allowable departure from the desired etch rate ratio is $\pm Z_2/(Z_1-V)$. Since this expression is a function of the height of feature 117 it will be seen that using a non-planar sacrificial layer according to the present invention gives greater processing latitude than using the planar sacrificial layer desired in prior planarization techniques.

Much of the above discussion has focused on applications of the present invention to plasma planarization of substrate layer 130. However, the techniques of the present invention can also be applied to initial planarization of base substrate 160 as well as any subsequently applied substrate layers. Both topographical projections and recesses may be plasma sculptured according to the present invention. Further, the etch rate ratio may be selected over a wide range of values to create a variety of different resulting surface topographies. In general, where the substrate layer is etched at a significantly faster rate than the sacrificial layer surface dimensions and topographical feature angularites are decreased.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. A method of plasma planarization of a topographically rough surface layer comprising:
   selecting a sacrificial layer having an etch rate different from the etch rate of said surface layer in a given plasma environment;
   applying said sacrificial layer over said surface layer; and
   plasma etching said sacrificial layer and said surface layer to produce a planar surface layer.

2. The method of plasma planarization according to claim 1, wherein said sacrificial layer is non-conforming to the rough topography of said surface layer when applied thereto.

3. The method of plasma planarization according to claim 1, wherein said sacrificial layer is completely removed from said surface layer during plasma etching.

4. The method of plasma planarization according to claim 1, wherein said sacrifical layer at least covers each feature of the rough topography of said surface layer.

5. The method of plasma planarization according to claim 1, wherein said etch rate of the sacrificial layer is at least 30% less than said etch rate of the surface layer in the plasma environment.

6. A method of planarizing a topographically rough surface on a substrate by plasma etching comprising:
   applying a sacrificial layer to said rough surface, wherein said sacrificial layer has, as a function of a plasma environment, an etch rate substantially different from the etch rate of said surface; and
   plasma etching said sacrificial layer and said surface to produce a topographically planar surface on said substrate.

7. The method of planarizing according to claim 6, wherein the differences of etch rates during said plasma etching compensates for non-planar surface features of said sacrificial layer.

8. The method of planarizing according to claim 6, wherein said plasma etching is anisotropic.

9. The method of planarizing according to claim 6, wherein said sacrificial layer includes low viscosity organic material.

10. The method of planarizing according to claim 6, wherein the ratio of said etch rate of the substrate to said etch rate of the sacrificial layer is in the range of 1.4 to 10.0.

11. The method of planarizing according to claim 6, wherein said plasma environment includes $CHF_3$ and $O_2$ gases.

12. The method of planarizing according to claim 11, wherein said etch rate ratio may be selected by controlling one of said gases flow rate.

13. A method of controlling the surface topography of a substrate layer comprising:

applying a sacrificial layer over the surface of said substrate layer; and etching said sacrificial layer and said substrate layer in a plasma environment, to remove said sacrificial layer and portions of said substrate layer to produce a selected surface topography on said substrate layer, as a function of the plasma etchant and the relative difference in etching rates of said sacrificial and substrate layers.

14. The method of controlling surface topography according to claim 13 wherein the ratio of etching rates of said sacrificial to said substrate layer is solely a function of the material forming said sacrificial layer and the thickness of that layer.

15. A method of producing a semiconductor device comprising the steps of forming an insulating layer on an uneven surface of a substrate having recesses and projections, said insulating layer having recesses and projections substantially corresponding to the recesses and projections of said substrate surface; applying a non-conforming sacrificial layer over said insulating layer; and plasma etching said sacrificial and insulating layers to completely remove said sacrificial layer and remove said insulating layer at a faster rate than said sacrificial layer and thereby decrease the recess and projection dimensions and sidewall angles on said insulating layer.

16. The method according to claim 15, wherein said insulating layer includes an oxide of the material comprising the surface of said semiconductor body.

17. The method according to claim 15, wherein said sacrificial layer includes a photoresist which at least completely fills and covers the recesses and projections of said insulating layer.

18. The method of removing surface irregularities from semiconductor layers to produce a substantially planar surface comprising:

applying at least one viscous sacrificial layer to at least cover said surface irregularities; and reactive ion etching said sacrificial layer at an etch rate whose ratio with respect to the etch rate of said surface irregularities is sufficiently less than unity so as to cause planarization of said semiconductor layers when said sacrificial layer is removed.

19. The method according to claim 18, wherein said sacrificial layer is of low viscosity and non-conforming to said surface irregularities.

* * * * *